United States Patent
Harrand et al.

(10) Patent No.: US 6,631,441 B2
(45) Date of Patent: Oct. 7, 2003

(54) DRAM READ AND WRITE CIRCUIT

(75) Inventors: Michel Harrand, Saint Egreve (FR); David Boise, Meylan (FR)

(73) Assignee: STMicroelectronics S.A., Gentilly (FR)

( * ) Notice: Subject to any disclaimer, the term of this patent is extended or adjusted under 35 U.S.C. 154(b) by 233 days.

(21) Appl. No.: 09/730,498

(22) Filed: Dec. 4, 2000

(65) Prior Publication Data

US 2001/0023473 A1 Sep. 20, 2001

(30) Foreign Application Priority Data

Dec. 7, 1999 (FR) .............................. 99 15435

(51) Int. Cl.[7] .............................................. G06F 12/00
(52) U.S. Cl. .................................. 711/105; 365/189.05
(58) Field of Search ....................... 711/105; 365/189.05

(56) References Cited

U.S. PATENT DOCUMENTS

| | | | |
|---|---|---|---|
| 5,765,185 A | 6/1998 | Lambrache et al. | 711/103 |
| 5,887,272 A | 3/1999 | Sartore et al. | 711/105 |

*Primary Examiner*—David L. Robertson
(74) *Attorney, Agent, or Firm*—Lisa K. Jorgenson; E. Russell Tarleton; Seed IP Law Group PLLC

(57) ABSTRACT

A dynamic random access memory circuit including a memory plane formed of an array of memory cells, as well as at least two cache registers enabling access to the memory plane and adapted to ensure the reading from and the writing into the memory. The circuit also includes several registers indicating the location of new words to be written, each of the indicative registers being coupled with one of the cache registers adapted to ensuring the writing into the memory.

17 Claims, 8 Drawing Sheets

DRAM READ AND WRITE CIRCUIT

TECHNICAL FIELD

The present invention relates to the field of electronic memories, and more specifically to fast dynamic random access memories (DRAMs).

BACKGROUND OF THE INVENTION

DRAMs are widely used. Indeed, they have the major advantage of having a large storage capacity. However, they have the disadvantage of being slow in terms of access time. Thus, it is desired to minimize this access time or, which amounts to the same thing, to use the memory so as to mask this access time.

In French patent application entitled "DRAM à structure rapide", filed on Mar. 26, 1998, under number 98/04008, the Applicant has endeavored finding a solution to this problem and discloses a DRAM associated with two cache registers located between the DRAM memory plane and a user system.

In another French patent application, entitled "Procédé de commande de mémoire DRAM rapide et contrôleur adapté", filed on Nov. 11, 1999, under number 99/14610, the Applicant describes a method and a controller to control the preceding DRAM. FIG. 1 shows a DRAM of this type.

In FIG. 1, a DRAM 1 includes a memory plane 2, a row decoder 3 controlled by control signals (RAS: Row Address Strobe, RAD: Row ADdress, RWB: Row Write Back) and a column decoder 4 controlled by signals (CAS: Column Address Strobe, CAD: Column ADdress, R/W: Read/Write). Memory 1 also includes an input DIN and an output DOUT enabling reading and writing of data.

Memory 1 also includes two cache registers A and B located between the memory plane and the column decoder. The presence of cache registers A and B enables, when one of the cache registers is in communication with the memory plane, writing or reading data in the other register. This results in a masking of the time of access to the memory plane. If the bursts relating to a same page are long enough, a continuous output data flow can be obtained. Also, if the bursts ("burst" designates a series of requests relating to the same page) are long enough, a totally masked memory refreshment can be performed.

A disadvantage of the structure of FIG. 1 is that, if the average burst duration is short, the output flow is not continuous.

Another disadvantage of the structure of FIG. 1 is that two accesses to the memory plane are necessary during a write operation. Indeed, it is first required to load the page to be modified in a cache register from the memory plane. Then, after the page contained in the cache register has been modified, the modified page must be rewritten into the memory plane, which requires a new access to the memory plane. In this case, for the output flow to remain uninterrupted, the bursts must have a duration at least equal to that of two cycles of access to the memory plane and, if a refreshment order is further input, a duration of at least three cycles of access to the memory plane.

SUMMARY OF THE INVENTION

The disclosed embodiments of the present invention overcome these disadvantages.

The disclosed embodiments of the present invention provide a DRAM circuit having an improved access time.

Another aspect of the present invention is to provide a DRAM circuit and a method for controlling the circuit enabling obtaining a significant time gain for all bursts, be they long (for example, an entire word page) or short.

A further aspect of the present invention is to provide a DRAM circuit and a method for controlling the circuit enabling obtaining a continuous output data flow, as in the case of a SRAM.

Yet another aspect of the embodiments of the present invention is to provide a DRAM circuit and a method for controlling the circuit enabling writing into a DRAM with a single access to the memory plane.

A further aspect of the present invention is to provide a DRAM circuit and a method for controlling the circuit that decreases the minimum burst duration enabling uninterrupted data supply by a DRAM.

To achieve the foregoing advantages and features as well as others, the embodiments of the present invention provide a dynamic random access memory (DRAM) circuit including a memory plane formed of an array of memory cells organized in rows and columns, a row decoder and a column decoder, each row of the memory plane corresponding to a word page. The memory circuit includes:

at least two cache registers coupled with the memory plane enabling reading words from a memory page and/or writing new words into a memory page, and several locating circuits or means, each of the locating means being coupled with one of the cache registers adapted to ensure a memory writing, and indicating the position, in the page, of the new words to be written into the memory.

According to an embodiment of the present invention, each of the cache registers is adapted to storing a complete word page.

According to another embodiment of the present invention, the cache registers are located between the memory plane and the column decoder.

According to a further embodiment of the present invention, each of the locating means is a register including as many bits as there are words in a page.

According to another embodiment of the present invention, the number of cache registers is equal to four, two cache registers being used for the reading, the two other cache registers being used for the writing, and the number of locating means is equal to two, each of the locating means being coupled with one of the two cache registers used for the writing.

According to yet another embodiment of the present invention, the number of cache registers is equal to three, said cache registers being usable indifferently for the reading or the writing, and the number of locating means is equal to three, each of the locating means being coupled with one of the cache registers.

According to a further embodiment of the present invention, the number of cache registers is equal to two, said cache registers being usable indifferently for the reading or the writing, and the number of locating means is equal to two, each of the locating means being coupled with one of the cache registers.

The embodiments of the present invention also provide a method for controlling a dynamic random access memory (DRAM) circuit including a memory plane formed of an array of memory cells organized in rows and columns, each row corresponding to a word page, a row decoder, a column decoder, and at least two cache registers coupled with the memory plane for reading and/or writing. The method includes, in write mode, the steps of:

(a) receiving a request for writing a new word into the memory, including a row address corresponding to the page of the new word, a column address corresponding to the location in the page of the new word, and said new word, the request being part of a series of requests, (b) storing the new word to be written in one of the cache registers adapted to ensuring a writing, (c) finding the location of the new word by means of a locating means coupled to said cache register, (d) repeating steps (b) and (c) as long as the next received request is a write request concerning the same page, and (e) when the next received request no longer is a write request concerning the same page, transferring into the memory plane said new words stored in said cache register by means of said locating means, the transfer occurring as soon as possible if said next received request is a write request concerning a different page, and the transfer being postponed if said next request is a read request.

According to an embodiment of the present invention, in the case of a reading concerning a page including new words waiting to be written stored in a first cache register, the method includes the steps of:

loading, from the memory plane, the considered page into a second cache register adapted to ensuring a reading, providing for a reading one or several desired words, said word(s) coming from said first cache register if these are new words waiting to be written, and said word(s) coming from said second cache register in the opposite case.

According to an embodiment of the present invention, in the case of a reading concerning a page including new words waiting to be written into a first cache register, the method includes the step of:

loading a second cache register adapted to ensuring a reading with the words of the considered page, these words coming from said first cache register if they are new words waiting to be written and coming from the memory plane in the opposite case.

The foregoing features and advantages of the embodiments of the present invention will be discussed in detail in the following non-limiting description of specific embodiments in connection with the accompanying drawings.

DETAILED DESCRIPTION OF THE INVENTION

It should be noted that in all drawings, the same references are used to designate corresponding elements.

Figure 1:
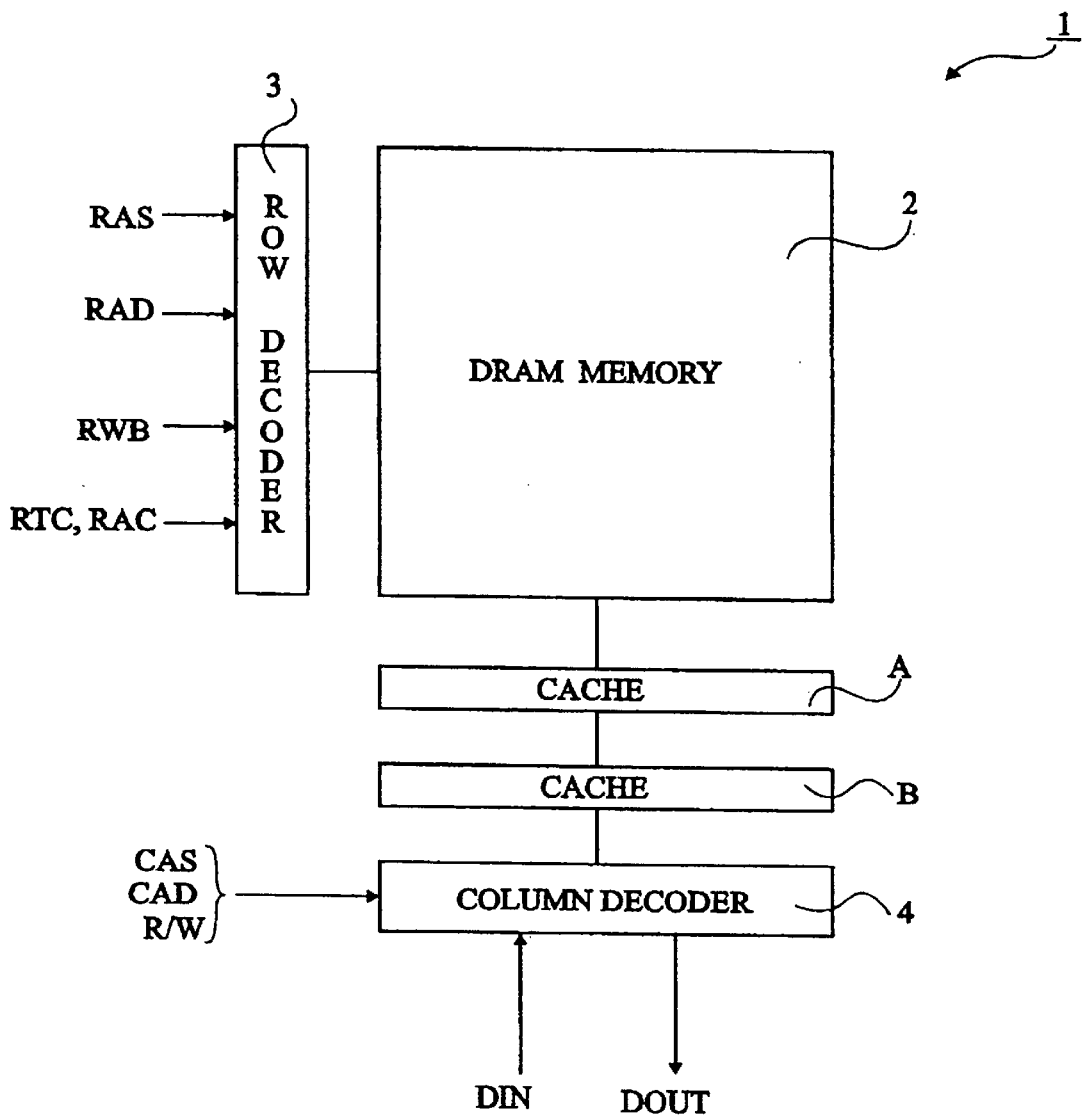
FIG. 1, previously described, shows a prior art DRAM structure.
Figure 2A:
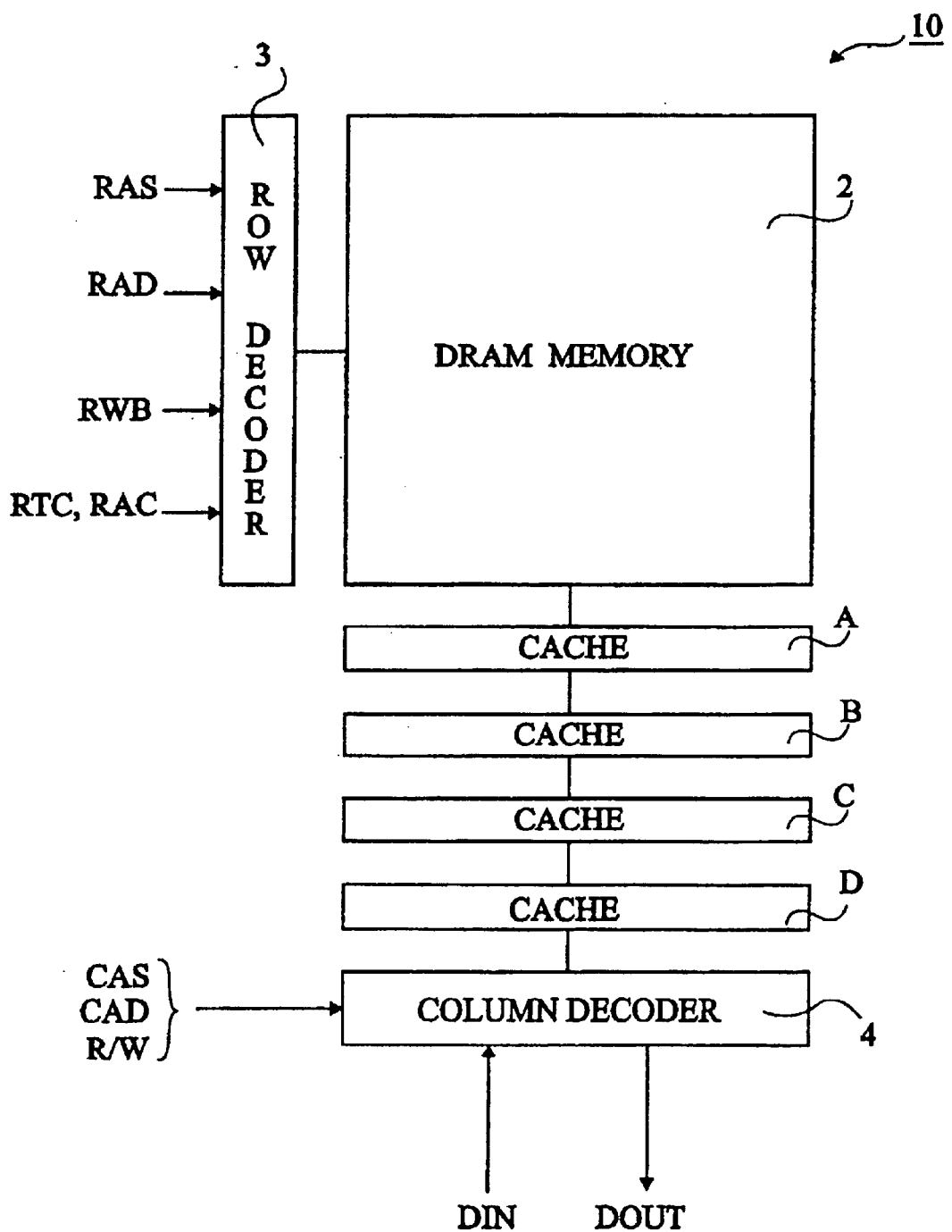
FIGS. 2A and 2B show simplified structures of DRAMs according to one embodiment of the present invention.
Figure 2B:
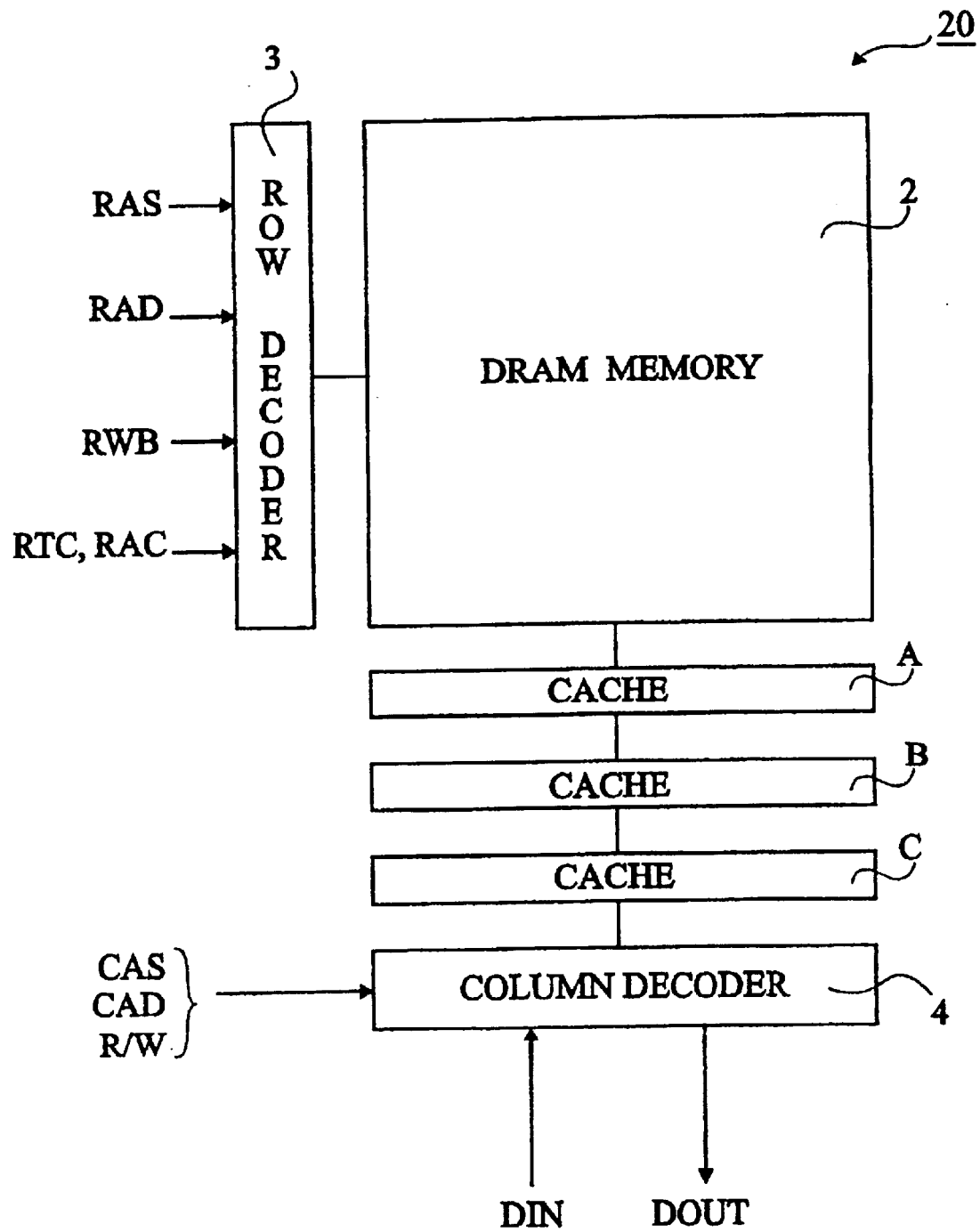

FIGS. 2A and 2B illustrate DRAMs, respectively 10 and 20 according to the present invention. The architecture of memories 10 and 20 is similar to the architecture of memory 1 of FIG. 1 and corresponding elements are designated with the same references.

In FIG. 2A, DRAM 10 includes four cache registers A, B, C, D. These cache registers, as will be seen hereafter, may all be in communication with the memory plane and are connected to at least one of input or output terminals DIN or DOUT of memory 10. They are located between memory plane 2 and column decoder 4.

In FIG. 2B, memory 20 has the same architecture as memory 10 of FIG. 2A, but it only includes three cache registers A, B, C. These cache registers may also all be in communication with the memory plane, and are connected to at least one of input or output terminals DIN or DOUT of memory 20, and are located between memory plane 2 and column decoder 4.

The advantage of placing the cache registers between the memory plane and the column decoder is that it enables storing therein a complete word row, that is, a complete page. It should however be noted that this feature is not essential. The cache registers may very well be located after the column decoder without departing from the scope of the present invention. This has the disadvantage that the maximum number of bits that can be stored in each of the cache registers cannot be greater than the number of bits present at the column decoder output and a complete page then cannot be stored in a cache register.

Specific embodiments of the present invention will now be described. It should be noted that those are discussed as an example only, and that any modification within the abilities of those skilled in the art belongs to the field of the present invention.

Figure 3:
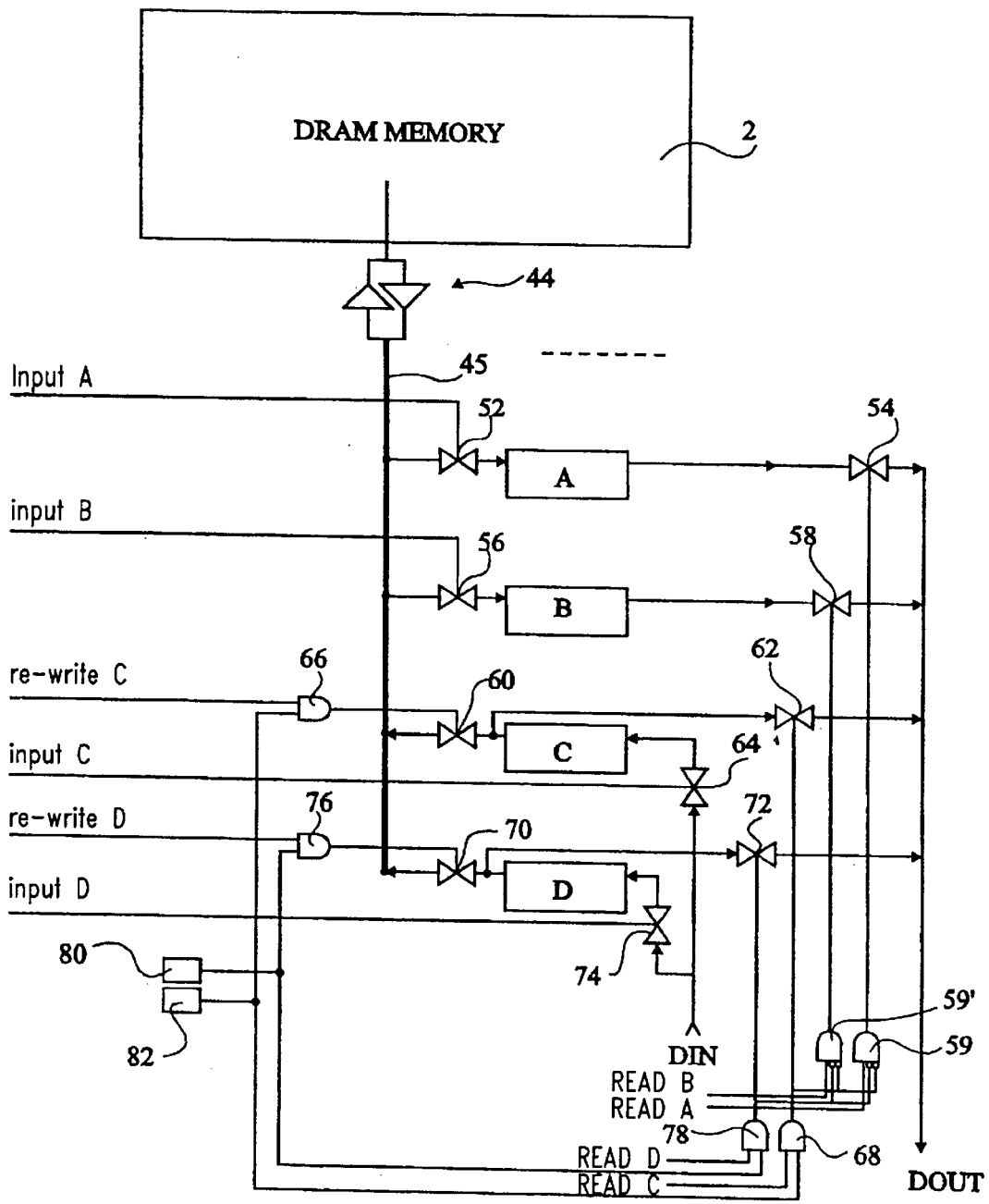
FIG. 3 shows a detailed embodiment of the present invention, corresponding to the DRAM of FIG. 2A.

FIG. 3 illustrates in detail the four cache register architecture of FIG. 2A. Two cache registers A and B are used for reading only. Cache register A is coupled to the bus 45 of access to the memory plane by a transfer gate 52 controlled by an input control signal of register A. The output of read cache register A is connected to a transfer gate 54 that couples cache register A with data output DOUT, enabling reading of the desired words. Similarly, read cache register B is coupled to the bus 45 of access to the memory plane by a transfer gate 56 controlled by an input control signal of register B and its output is coupled to the data output DOUT via a transfer gate 58. Transfer gates 54 and 58 are respectively controlled by logic circuits 59 and 59' enabling reading from cache registers A and B.

The two cache registers C and D are used for writing. An output terminal of write cache register C is coupled, on the one hand to the bus 45 of access to the memory plane by a transfer gate 60, and on the other hand to the output DOUT by a transfer gate 62. An input terminal of register C is coupled to the input DIN by a transfer gate 64, input DIN enabling input of new words to be written into the memory. Transfer gate 60 is controlled by an AND gate 66 receiving as an input a control signal for rewriting into register C. Transfer gate 64 is controlled by an input control signal of register C and transfer gate 62 is controlled by an AND gate 68, receiving as an input a signal for reading from register C. Similarly, an output terminal of write cache register D is connected to a transfer gate 70 for communication with the bus 45 of access to the memory plane and to a transfer gate 72 for communication with the data output DOUT. An input terminal of cache register D is connected to a transfer gate 74 for communication with data input DIN. Transfer gate 70 is controlled by an AND gate 76 and transfer gate 72 is controlled by an AND gate 78, gates 76 and 78 respectively receiving as an input a control signal for rewriting into register D and a signal for reading from register D. Transfer gate 74 is controlled by an input control signal of register D.

The structure of FIG. 3 also includes two registers 80 and 82 for finding the location, in the page, of new words to be written into the memory. The output of register 80 controls AND gates 76 and 78, and the output of register 82 controls AND gates 66 and 68. Each of registers 80 and 82 includes as many bits as there are words. It should be noted that, in the present invention, "word" is not used in a limiting sense, and only designates a set of bits processed together. Thus, if the memory uses a division into bytes, "word" will designate a set of eight bits, that is, a byte.

Indicative registers 80 and 82 can be globally reset by a memory controller (not shown) by means of a control signal (also not shown) for each of the indicative registers. Each time a new word is loaded into one of the cache registers to be written, the bit corresponding to this word is set to "1" in the register 80 or 82 corresponding to the cache register being written into. Thus, conversely to prior art, the cache register only contains the new words of a page, and not the complete page.

The operation of the embodiment according to FIG. 3 will now be explained.

In the case of a writing, it is first required to load a write cache register (preferably that which has not been used the preceding time) with the new words of the page. As seen, the corresponding register indicative of the location of the new words finds, by the location of the bits set to "1", the locations of the words to be written in the page. Upon access to the memory plane for rewriting into the memory, transfer gate 60 or 70 is enabled for the sole new words (register output equal to "1") and only the content of the new words in the page is transferred to the memory plane. As for the other words of the same page, the read amplifier belonging to sense amplifiers 44 is forced by no signal from any of the cache registers (transfer gate 60 or 70 blocked), and the voltage balance causes the word refreshment, which is an advantage that will be reminded hereafter. When the entire content of the cache register has been transferred into the memory plane, the memory controller sets back to zero the content of the register that indicates the location of the corresponding new words.

Thus, in the case of a writing, the advantage of the structure of FIG. 3 is double: On the one hand, only one access to the memory plane is necessary and, on the other hand, a refreshment of the unmodified words in the page is automatically performed.

If write requests concerning different pages follow one another, the controller writes the data concerning a new page into the free write cache register and controls, meanwhile, the rewriting of the other write cache register into the memory plane.

In the case of a reading, if the page to be read, page X for example, is not already present in a read cache register A or B, an access to the memory plane is first required to load this page into one of the two read registers, preferably the read register which has not been used last, for example cache register A. Once register A has been loaded, the memory plane is available again for another operation and it remains isolated from read cache register A. All the desired data can then be read from the considered page X, and, as long as the user system requests will concern words to be read from page X, the data to be read will be directly available at the output of read register A. This access is fast, the cache registers being fast access memories.

In case of occurrence of a read request concerning another page, page Y for example, this page will be loaded from the memory plane into the read cache register which has not been used the preceding time, that is, register B. The memory controller will then enable access to the data of page Y, stored in a read register B. In the operation such as described up to now in the case of a read request, the system behaves in the same way as in the case of FIG. 1.

The case where a read burst (formed of one or several requests) follows a write burst (also formed of one or several requests) will now be described.

If the read burst that follows the write burst concerns a different page, the memory controller, which detects a write-to-read transition associated with a page address change, orders an access to the memory to load the page to be read to the read cache register which has not been used by the preceding read burst. The transfer from the write cache register to the memory plane is then delayed until the memory is no longer occupied by the read access. Of course, as long as the transfer to the memory plane has not been performed, the write cache register keeps the new words, the register indicative of the location of the new words corresponding to this write register is not reset and the memory controller keeps track of the fact that this register has not been transferred, as well as the address of the concerned page.

The case where a read burst (formed of one or of several requests) follows a write burst (also formed of one or of several requests) will now be considered, the read burst concerning the same page as the write burst. This case is processed by the structure of the present invention in an original way without requiring any additional time. Indeed, in this case, the controller orders the transfer of the considered page into one of the read cache registers from the memory plane. Assume that this is cache register A. The page transferred into cache register A is the still unmodified page. Indeed, one of the two write cache registers (assume that this is register C) contains the new words and register 82 associated with register C contains the indicator of the location of the new words, since the content of register C has not been transferred yet into the memory plane. To process this case without losing time, the controller provides a signal, when the page is available to be read, indicating that the concerned write register C contains new words of the same page as that of read register A, and it will control transfer gates 54 and 62 so that, if the word to be read does not correspond to a new word provided by the preceding write burst, the word is read from the read cache register and, if the word to be read corresponds to a new word of the preceding write burst, it is read from the write cache register. It can thus be seen that, even when the read request concerns a page having some new words in a cache register, which have not been transferred to the memory plane yet, the method according to the present invention avoids any additional access to the memory plane, which results in a time gain. Further, as previously, the content of the write register will be transferred to the memory plane, and its register indicative of the location of the new words will be reset when the memory plane is accessible again.

Figure 4:
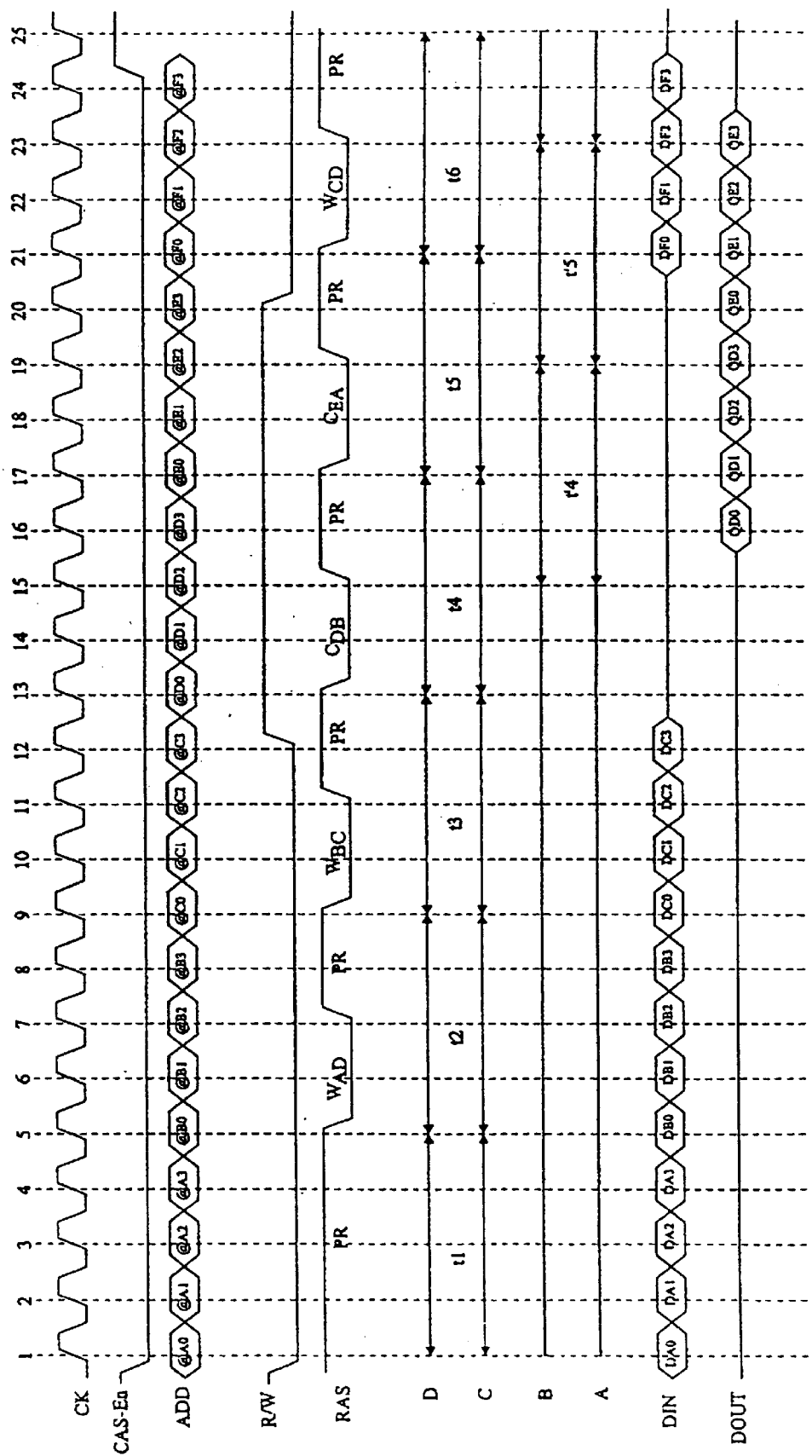
FIG. 4 shows a timing diagram illustrating the operation of the embodiment of FIG. 3.

FIG. 4 shows a timing diagram illustrating an example of operation of the memory circuit of FIG. 3. This example is not intended to be limiting and is intended, by the concrete discussion of a few cases to make the operation of the circuit of FIG. 3 less abstract.

In FIG. 4, a line CK illustrates 24 periods, ranging from times 1 to 25, of a clock driving the circuit of FIG. 3. The next line illustrates a signal CAS-En (Column Address Strobe—Enable) which, as combined with clock CK, provides column address signal CAS, which samples the addresses presented by the requests. These addresses are shown at the next line, ADD, where symbol "@ A0" means "address of word 0 of page A", "@ B1" means "address of word 1 of page B", etc. The next line illustrates signal R/W carried by the request, indicating whether the word at the indicated address is to be read (in the provided example, if R/W is at 1) or to be written (here, if R/W is at 0). The examination of lines ADD and R/W indicates that, in the given example, the requests first include three bursts, each including four addresses of words to be written, followed by two bursts of words to be read of four addresses each, then by a burst of four addresses of words to be written. The fact that, in the present example, there only are four-word bursts, is not limiting since each burst may have, as seen, any number of words, with no relation with the number of words of the neighboring bursts. Further, "word 0", "word 1", etc. are used to find the request order, and do not correspond, except by chance, to the position of the words in the page or to an increasing order of these words, since the successive requests of a burst may concern words having any order in the page.

When new words are to be written, input DIN of the memory circuit includes data DA0, DA1, . . . , DC2, DC3, and DF0, . . . , DF3 corresponding to words to be written at respective addresses @ A0, @ A1, . . . , @ C2, @ C3, and @ DF0, . . . , @DF3.

Signal RAS indicates the accesses to the memory plane. When the memory plane has not been accessed to, signal RAS is at a high level, corresponding to a preload level indicated by PR in FIG. 4. When access is had to the memory plane, signal RAS switches to a low level and a data exchange can occur between the memory plane and one of the cache registers. As soon as this transfer has occurred, the memory plane is isolated from the cache registers and signal RAS returns to its preload level.

The four next lines, D, C, B, and A illustrate the operation of the cache registers, reminding that cache registers C and D are used for writing only, and cache registers A and B are used for reading only.

At time t1, included between times 1 and 5, data DA0 to DA3 are written into one of the two write cache registers, which is free at this time, here register D. No access to the memory plane occurs during this time interval.

At time t2, included between times 5 and 9, data DB0 to DB3 of the current burst are on the one hand written into write cache register C, which has not been used the preceding time, and, the data of page A that are stored in cache register D are on the other hand transferred into the memory plane. This is illustrated by symbol $W_{AD}$, on the line of signal RAS, which means "rewriting page A into the memory plane from register D".

At time t3 (between times 9 and 13), there occur on the one hand the writing into cache register D that has just been freed from page C of the current burst and, on the other hand, the rewriting into the memory plane of page B from cache register C, which is illustrated by symbol $W_{BC}$. If the next requests were write requests, the preceding process would continue uninterruptedly, one of the cache registers receiving the new words of the current requests, the other cache register meanwhile transferring the previously received data into the memory plane.

At time t3, the current request is a read request, followed by other read requests until time 20. These read requests form, in the non-limiting example shown, two read bursts, each including four requests and respectively concerning pages D and E.

In the method of the present invention, the access to the memory plane that starts at time 13 is not used to rewrite into the memory plane the new words stored while waiting to be rewritten, which would result in a loss of time, but is used to load the page to be read, D, into one of the read cache registers, here register B. This is shown on line RAS by symbol $C_{DB}$, which means loading, from the memory plane, page D into register B. The loading of register B ends at time 15, and the reading from register B will be performed during period t'4, from time 15 to 19. Output DOUT of the circuit of FIG. 3 presents, with a delay of one clock cycle, words 0 to 3 to be read of page D, represented by symbols QD0, QD1, QD2, and QD3 on line DOUT of FIG. 4.

At time 17, an access to the memory plane is possible, and page E is loaded from the memory plane into the available read cache register, that is, register A. This is represented by symbol $C_{EA}$ on line RAS. The content of page E is available at time 19, and the reading of the words to be read E0, . . . , E3 is performed during period t'5, from times 19 to 22, the words to be read only being effectively present on output DOUT at times 20 to 22 (symbols QE0, QE1, QE2, and QE3). Further, during period t'5, read cache register B is free and if other read bursts had come up, cache register B would have been loaded during the reading of register C, and so on.

At time 21, however, in the example shown, a write burst concerning page F comes up. An access to the memory plane will take place at time 21 and, during period t6, from times 21 to 25, the new words to be written into page F will be written into the free write cache register, that is, register C, which is represented by symbol $W_{CD}$ at the level of signal RAS. Indeed, register D still contains the new words to be written of page C and, from the end of period t3, that is, during periods t4 and t5 from times 13 to 21, the memory plane has always been occupied in the example shown and this page has not been able to be rewritten into the memory plane. Thus, the new words of page C, waiting to be rewritten into cache register D, will be transferred into the memory plane during period t6.

It can thus be seen that, in the method of the present invention, if a read request follows a write request, the read request is first processed, the rewriting into the memory plane occurring afterwards and, in the example shown, at the next write request.

It should again be noted that FIG. 4 only illustrates a few examples of use of the circuit of FIG. 3 and that all possible cases have not been illustrated. In particular, in FIG. 3, all bursts have the same length and their duration corresponds to one access time (plus the preloading) of the memory plane, while none of these aspects is of course essential and is even rather unlikely to occur in practice. Also, the case where a write request is followed by a read request concerning the same page, with the new words of said page not having been transferred yet into the memory plane, is not considered in FIG. 4, this case having been extensively considered previously.

Figure 5:
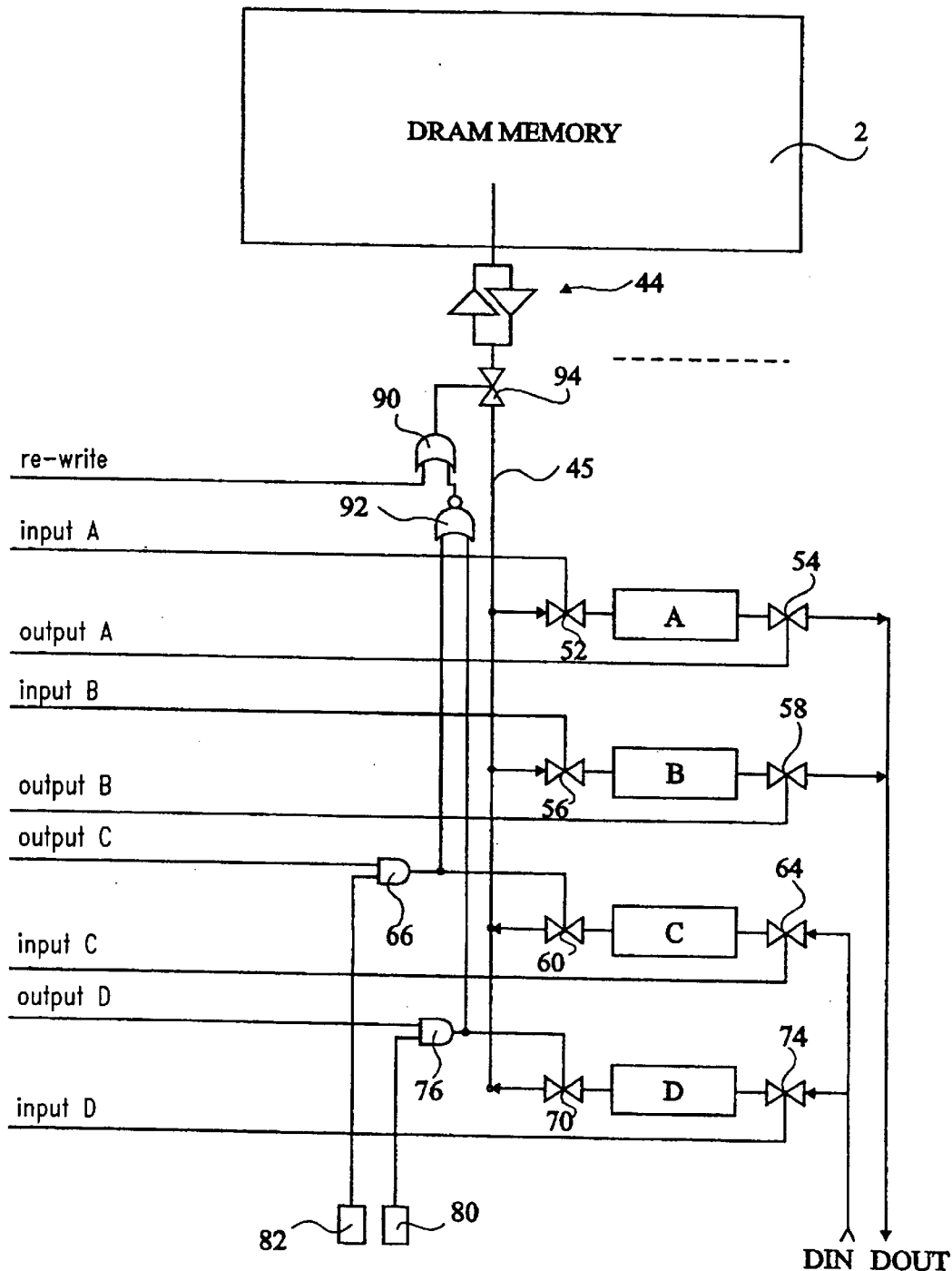
FIG. 5 shows an alternative of the embodiment of FIG. 3.

FIG. 5 illustrates an alternative of the embodiment of FIG. 3, precisely enabling a different processing of the case where a write burst (formed of one or of several requests) is followed by a read burst (also formed of one or several requests) concerning the same page. In this alternative, which is more simple to implement, at the time of the read page loading into the read cache register, the controller ascertains that, if the words to be read do not correspond to new words of the preceding write burst, the words written into the read cache register come from the memory plane and, in the opposite case, the word written into the read cache register comes from the considered write cache register. Thereby, the readings by a user system are always performed in one of read cache registers A and B and are thus simplified. It can thus be seen that in FIG. 5, unlike in FIG. 3, write cache registers C and D are not connected to data output DOUT. This alternative embodiment also simplifies the structure, since transfer gates 62 and 72 and their management have become unnecessary, but additional logic circuits (transfer gate 94, OR gate 90 and NOR gate 92) are required to block, via transfer gate 94, bus 45 of access to the memory plane. Thus, when the data to be written into the read cache register come from a write cache register, transfer gate 94 is blocked and amplifier bus 45, isolated from the memory plane, receives the data from said write cache register, which are transmitted to the corresponding read cache register.

Figure 6:
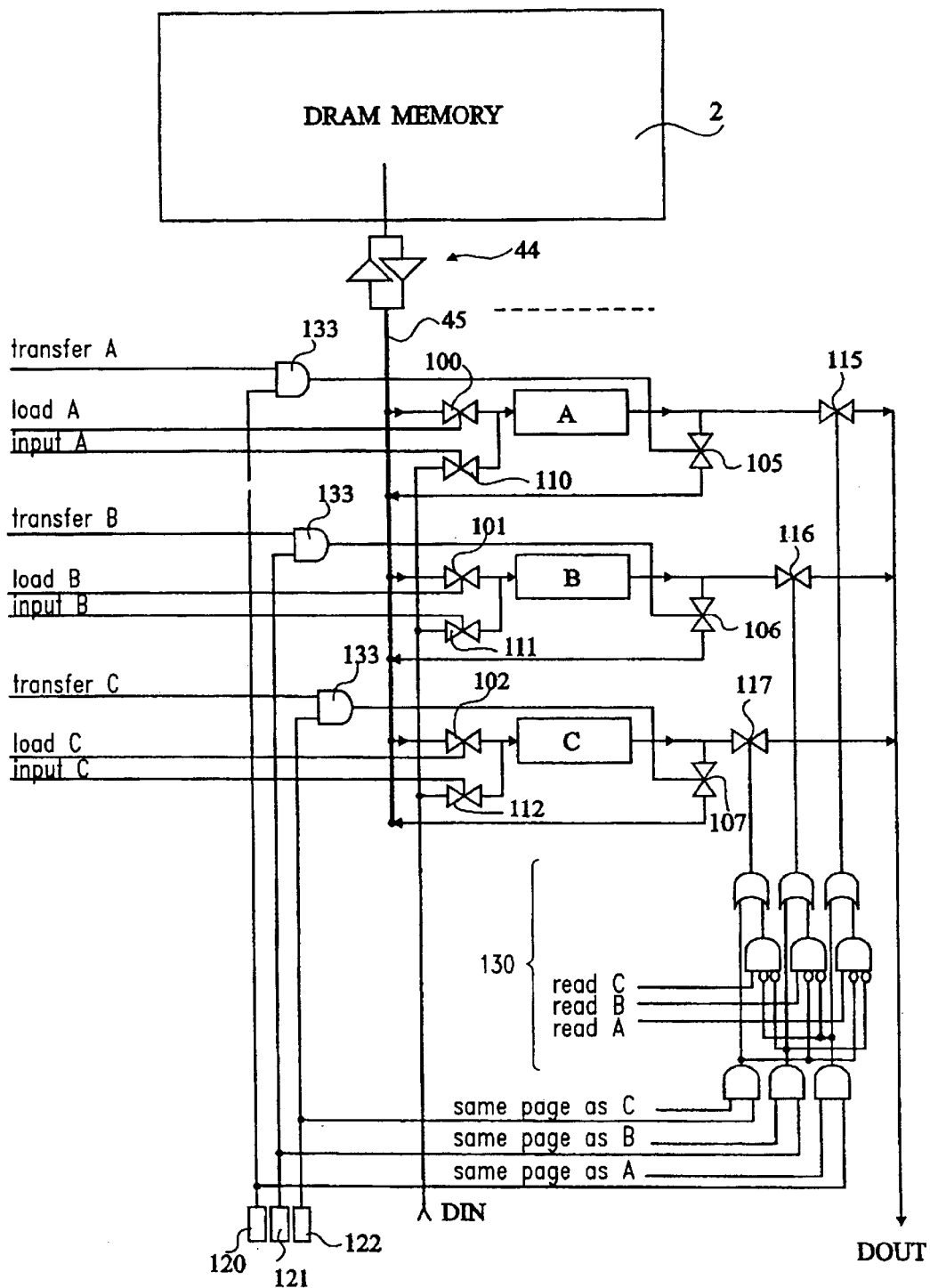
FIG. 6 shows another detailed embodiment of the present invention, corresponding to the DRAM of FIG. 2B.

FIG. 6 illustrates another embodiment of the present invention. This embodiment provides three cache registers A, B, C, each register being indifferently used for the reading or the writing. These registers each include an input coupled on the one hand to bus 45 of access to the memory and, on the other hand, to data input DIN. The output of each of the cache registers is coupled to data output DOUT and to access bus 45.

The loading of the memory plane data via access bus 45 into each of cache registers A, B, C is performed via a transfer gate, respectively 100, 101, and 102. The loading of the content of each of cache registers A, B, C into the memory plane via access bus 45 is performed via a transfer gate, respectively 105, 106, and 107. Also, a transfer gate, respectively 110, 111, and 112 couples the input of each of cache registers A, B, C to data input DIN and a transfer gate, respectively 115, 116, and 117, couples the output of each of cache registers A, B, C to data output DOUT.

Each of cache registers A, B, C being likely to be used in the write mode, each of the cache registers is connected to a register, respectively 120, 121, and 122, indicative of the location of the new words to be written. The function of registers 120, 121, and 122 is similar to that of registers 80 and 82 of FIG. 3. Finally, various logic circuits 130, 133, which are not described in detail, are used to control the transfer gates and enable an adequate progress of the data.

The operation of the structure of FIG. 6 differs from that of FIG. 3 in that the cache registers can here be interchanged, and it is possible to transfer the content of a page of the memory plane into any one of the cache registers. It is also possible to transfer the content of any one of these cache registers into the memory plane. It can also be written from input DIN of the DRAM into any one of the cache registers and it can be read from output DOUT of the DRAM from any one of these registers.

Since the cache registers can be interchanged, it is advantageous to establish a priority order for the use of the cache registers. Thus, it may be established that, if register A is free, the controller will choose register A. If A is occupied, the controller will choose B if free, and if none of registers A and B is free, it will choose register C.

In FIG. 6 as in FIG. 3, registers 120, 121, 122, indicative of the location of the new words, contain a number of bits corresponding to the number of words that can be written into each of the cache registers, their bit being set to one when the corresponding cache register operates in write mode and when the word is a new word to be written.

It has been seen, in relation with FIG. 3, that there could be a problem in the case where a page is in one of the cache registers with new words waiting to be transferred to the memory plane, and where a request for reading this same page is presented.

In FIG. 6, this problem is solved in a way similar to that of FIG. 3, that is, upon reading, the word provided at output DOUT is read from the cache register loaded from the memory plane with the still unmodified page if the word is not a new word and, if the word is a new word present in another cache register waiting to be rewritten, it is read from this other cache register. As in FIG. 3, the subsequent writing of the cache register containing the new words is performed during a next access to the memory plane.

Figure 7:
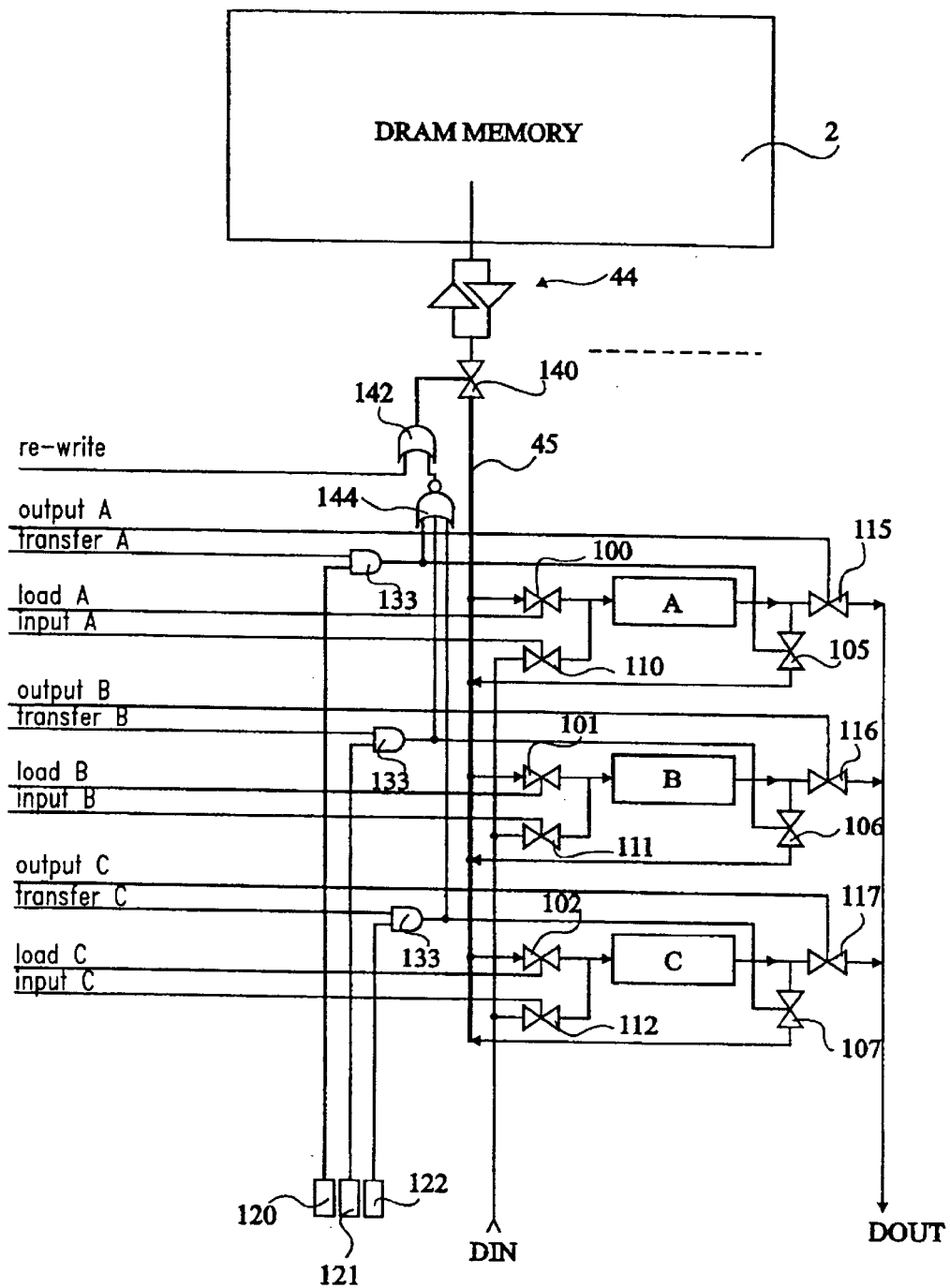
FIG. 7 shows an alternative of the embodiment of FIG. 6.

FIG. 7 illustrates an alternative of the embodiment of FIG. 6. This alternative embodiment corresponds to the alternative embodiment of FIG. 5 and illustrates another way of solving the page reading problem, when this page includes new words present in a first cache register and waiting to be written into the memory plane. The retained solution is the same as in FIG. 5. A transfer gate 140 blocks the access of bus 45 of access to the memory plane. Transfer gate 140 is controlled by an assembly of logic circuits 142, 144. Thus, if a read request occurs concerning a page located in a first cache register waiting to be written into the memory plane, a second cache register used in the read mode is loaded with words of the memory plane if these words do not correspond to new words waiting to be written and with words of the first cache register otherwise.

The advantage of having four differentiated cache registers as in the case of FIGS. 3 and 5, or three undifferentiated cache registers as in the case of FIGS. 6 and 7, is to enable a great flexibility of use and an uninterrupted output flow for bursts of shorter duration than in prior art.

However, a structure where two cache registers only are present, as in FIG. 1, cooperating with two registers indicative of the location of new words, is also advantageous and enables suppressing an access to the memory plane in the case of a writing. Such a structure belongs to the field of the present invention when modified by the teachings herein. Two embodiments of such a structure can easily be derived from FIGS. 6 and 7, respectively, by suppressing all that concerns register C, and are not illustrated. The operation of these embodiments is similar to that of FIGS. 6 and 7, respectively, and will not be described in further detail. Although having a lower performance in terms of flexibility and time gain than the embodiments of FIGS. 3, 5, 6 and 7, these embodiments have advantages with respect to the prior art of FIG. 1. Thus, the presence of the registers indicative of the location of new words enables gaining time in the write mode, since a previous loading of the page to be written in no longer necessary. In fact, a circuit according to the present invention with two cache registers only provides the same advantages as the circuits of FIGS. 3, 5, 6, and 7 in the case of a series of write bursts (thus concerning different pages), or in the case of a series of read bursts (thus also concerning different pages). However, the circuit with two cache registers according to the present invention has a lower time performance as compared to the circuits with three or four cache registers according to the present invention, when passing from a write burst to a read burst, except if the read burst is long enough, which is not the general case. In practice, if read bursts follow a write request, the page concerned by the first read burst will be loaded from the memory plane into the cache register that is free and does not contain the new words to be written into the memory plane. The transfer into the memory plane of the new words stored in the cache register used for the writing will occur as soon as the memory plane is accessible again, and thus just after the loading of the first read burst, to free the cache register used in the writing, to be able to use this register for the loading of the page concerned by the second read burst.

In all embodiments, it will be well advised to gather the read requests and the write requests, to obtain sufficiently long bursts to mask the times of access to the memory.

Further, in all embodiments, the transfer into the memory plane of new words contained in a cache register automatically ensures the refreshment of the unmodified words of the considered page. Indeed, as described in relation with FIG. 3, when the rewrite control signal is activated, only the content of the word having its corresponding bit of the register indicative of the location of new words at "1" is transferred to sense amplifiers 44 connected to access bus 45, amplifiers 44 forcing the information of the bit line of the memory plane. In the case of an unmodified word, access bus 45 remains in high impedance, and the voltage balance at the level of amplifiers 44 automatically refreshes the information present on the bit line (and thus of the selected memory cell).

It should further be noted that, in the present invention, the addresses of a burst are any addresses of words of a given page, the order of these addresses being of little importance. Indeed, since the controller enables fast and independent access to each word of the stored page, the addresses of these words have no need to be consecutive or follow any order to be efficiently processed.

Of course, the present invention is likely to have various alterations, modifications, and improvements which will readily occur to those skilled in the art. In particular, it is possible to modify the embodiments of FIGS. 6 and 7 (and their equivalent in the case of two cache registers only) by replacing each of the couples of one-way transfer gates, respectively 100/105, 101/106, and 102/107 with a single bidirectional transfer gate connected to a terminal of each of the cache registers and to access bus 45, those skilled in the art easily adapting the logic control circuits of the one-way gates to control this single bidirectional gate, as well as the structure of the cache registers, which will have to have at least one terminal enabling data input and output.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A dynamic random access memory circuit including a memory plane formed of an array of memory cells organized in rows and columns, a row decoder and a column decoder, each row of the memory plane corresponding to a word page, comprising:
   at least two cache registers coupled with the memory plane enabling reading words from a memory page and writing new words into a memory page using the respective cache registers, and
   a plurality of locating means, each of the locating means is coupled to one of the cache registers and is adapted to ensure a memory writing using the respective cache register, and indicating the position, in the page, of the new words to be written into the memory.

2. The memory circuit of claim 1, wherein each of the cache registers is adapted to storing a complete word page.

3. The memory circuit of claim 1, wherein the cache registers are located between the memory plane and the column decoder.

4. The memory circuit of claim 1, wherein each of the locating means comprises a register including as many bits as there are words in a page.

5. The memory circuit of claim 1, comprising four cache registers, two cache registers being used for the reading, the two other cache registers used for the writing, and further comprising two locating means, each of the locating means coupled to one of the two cache registers used for the writing.

6. The memory circuit of claim 1, comprising three cache registers, said cache registers being usable indifferently for the reading or the writing, and further comprising three locating means, each of the locating means being coupled to one of the cache registers.

7. The memory circuit of claim 1, comprising two cache registers, said cache registers usable indifferently for the reading or the writing, and further comprising two locating means, each of the locating means being coupled to one of the cache registers.

8. A method for controlling a dynamic random access memory circuit including a memory plane formed of an array of memory cells organized in rows and columns, each row corresponding to a word page, a row decoder, a column decoder and at least two cache registers coupled with the memory plane for reading and/or writing, the method comprising, in write mode, the steps of:
   (a) receiving a request for writing a new word into the memory, including a row address corresponding to the page of the new word, a column address corresponding to the location in the page of the new word, and said new word, the request being part of a series of requests,
   (b) storing the new word to be written in one of the cache registers adapted to ensuring a writing to the memory,
   (c) finding the location of the new word by means of a locating means coupled with said cache register,
   (d) repeating steps (b) and (c) when the next received request is a write request concerning the same page, and
   (e) when the next received request no longer is a write request concerning the same page, transferring into the memory plane said new words stored in said cache register by means of said locating means, the transfer occurring without postponement when said next received request is a write request concerning a different page, and the transfer being postponed when said next request is a read request.

9. The method of claim 8, further comprising, in the case of a reading concerning a page including new words waiting to be written stored in a first cache register, the steps of:
   loading, from the memory plane, the considered page into a second cache register adapted to ensuring a reading,
   providing for a reading at least one desired word, said at least one word coming from said first cache register when these are new words waiting to be written, and said word coming from said second cache register in the opposite case.

10. The method of claim 8, further comprising, in the case of a reading concerning a page including new words waiting to be written into a first cache register, the step of:
   loading a second cache register adapted to ensuring a reading with the words of the considered page, these words coming from said first cache register if they are new words waiting to be written, and coming from the memory plane in the opposite case.

11. A dynamic random access memory (DRAM), comprising:
- a DRAM memory;
- a row decoder coupled to the memory;
- a column decoder coupled to the memory;
- first, second, and third cache registers coupled between the column decoder and the memory, each cache register configured for reading and writing operations;
- a control circuit selectively coupling the first, second, and third cache registers to the memory and to control and data inputs and outputs, the control circuit configured to enable reading and writing operations between the memory and the first, second, and third cache registers, and among the first, second, and third cache registers themselves.

12. The memory of claim 11, wherein the first, second, and third cache registers are coupled in parallel to a bus line that is coupled to the memory through a sense amplifier circuit.

13. The memory of claim 12, where the memory comprises an array of memory cells organized into rows and columns, each row corresponding to a word page; and the control circuit comprises first, second, and third registers coupled to the first, second, and third cache registers respectively and configured to enable writing of each cache register into the memory at the position in the memory page of the new words to be written into the memory.

14. A dynamic random access memory (DRAM), comprising:
- a DRAM memory;
- a row decoder coupled to the memory;
- a column decoder coupled to the memory;
- first, second, third, and fourth cache registers coupled between the column decoder and the memory, the first and second cache registers configured for reading operations and the third and fourth cache registers configured for writing operations; and
- a control circuit selectively coupling the first, second, third, and fourth cache registers to the memory and to control and data inputs and outputs, the control circuit configured to enable reading operations between the memory and the first and second cache registers, writing operations between the memory and the third and fourth cache registers, and reading and writing operations among the first, second, third, and fourth cache registers themselves.

15. The memory of claim 14, wherein the first, second, third, and fourth cache registers are coupled in parallel to a bus line that is coupled to the memory through a sense amplifier circuit.

16. The memory of claim 15, wherein the memory comprises an array of memory cells organized in rows and columns, each row of the memory corresponding to a word page; and the control circuit comprises first, second, third, and fourth registers coupled to the first, second, third, and fourth cache registers, respectively, and configured to enable writing of the third and fourth cache registers into the memory at the position in the word page of new words to be written into the memory.

17. A method for controlling a dynamic random access memory (DRAM) circuit that has a memory formed of an array of memory cells organized in rows and columns, each row corresponding to a row page, and at least two cache registers coupled to the memory for reading and writing operations, the method comprising;
- receiving a request for writing a new word into the memory and storing the new word to be written in one of the cache registers;
- finding the location of the new word by means of a locating circuit coupled to the cache register in which the new word is stored;
- repeating storing the new word and finding the location of the new word when a subsequent request for writing a new word into the memory at the same page is received;
- when the next received request no longer is a write request concerning the same page, transferring the new words stored in the cache register into the locations located by the locating means and postponing the transferring when a read request is received and ending the postponing when the next request is not a read request; and
- receiving a request for reading a word from the memory and loading the requested word from the memory into a second cache register when the requested word is written in the memory and loading the requested word from the first cache register when the requested word is waiting to be written.

* * * * *

UNITED STATES PATENT AND TRADEMARK OFFICE
CERTIFICATE OF CORRECTION

PATENT NO. : 6,631,441 B2
DATED : October 7, 2003
INVENTOR(S) : Michel Harrand et al.

It is certified that error appears in the above-identified patent and that said Letters Patent is hereby corrected as shown below:

<u>Title page,</u>
Item [75], Inventors, the second listed inventor's name should read -- David Doise --.

Signed and Sealed this

Twenty-seventh Day of January, 2004

JON W. DUDAS
*Acting Director of the United States Patent and Trademark Office*